United States Patent [19]

Wood et al.

[11] Patent Number: 4,808,112

[45] Date of Patent: Feb. 28, 1989

[54] HIGH DENSITY CONNECTOR DESIGN USING ANISOTROPICALLY PRESSURE-SENSITIVE ELECTROCONDUCTIVE COMPOSITE SHEETS

[75] Inventors: Brian J. Wood, Hillsboro; Peter M. Compton, Beaverton; Jerome P. Gianotti, Portland, all of Oreg.

[73] Assignee: Tektronix, Inc., Beaverton, Oreg.

[21] Appl. No.: 911,538

[22] Filed: Sep. 25, 1986

[51] Int. Cl.$^4$ .............................................. H01R 9/09
[52] U.S. Cl. ........................................ 439/66; 439/67
[58] Field of Search ................................ 439/65–77, 439/91, 492, 493, 591

[56] References Cited

U.S. PATENT DOCUMENTS

| | | | |
|---|---|---|---|
| 3,904,934 | 9/1975 | Martin | 439/74 |
| 4,509,099 | 4/1985 | Takamatsu et al. | 439/65 |
| 4,538,865 | 9/1985 | Wakabayashi et al. | 439/66 |
| 4,636,018 | 1/1987 | Stille | 439/91 |
| 4,655,524 | 4/1987 | Etzel | 439/86 |

FOREIGN PATENT DOCUMENTS 2155251  9/1985  United Kingdom ............... 439/69

*Primary Examiner*—Neil Abrams

*Attorney, Agent, or Firm*—Allston L. Jones; Robert S. Hulse

[57] ABSTRACT

A high density connector in which the conductive leads of at least two circuit boards, two flexible circuits, or one of each are interconnected directly without the use of a traditional molded connector with pins captured therein. This is accomplished by overlapping the two boards with the conductive paths on each to be interconnected facing each other. An anisotropic elastomeric polymer material is inserted between the boards and then the sandwich is clamped together compressing the polymer material to provide a low electrical resistance path therethrough to interconnect the conductive paths on the respective circuit boards. One disclosed embodiment utilizes backing plates above and below the sandwich with a plurality of screws passing through registration holes to align the conductive paths and to provide closure of the connector. The other disclosed embodiment is designed to interconnect two boards along substantially the full width of the boards. This is accomplished with clamping bars that have thumb screws at either end and at selected spacings along the length of the clamping bars to ensure closure between the two boards. The thumb screws here also pass through registration holes in the sandwich to align the conductive paths. Further, bosses are included around each of the thumb screw holes in the clamping bars to align the boards.

6 Claims, 8 Drawing Sheets

HIGH DENSITY CONNECTOR DESIGN USING ANISOTROPICALLY PRESSURE-SENSITIVE ELECTROCONDUCTIVE COMPOSITE SHEETS

BACKGROUND OF THE INVENTION

This invention relates to apparatus for electrically interconnecting flexible circuit strips and etched circuit boards, one with the other. In particular, the present invention relates to high density connectors with decreased insertion losses and cross-talk between the conductive paths.

Over the last decade, great strides have been made in miniaturization of electronic circuit components. However, the reduction in the size of the connectors needed to interconnect those devices into subsystems has not progressed nearly as quickly. A decade ago the connectors with the highest density required 0.025 of a square inch of board space for each conductor in the connector. Today, the highest density connectors require 0.011 of a square inch of board space for each conductor.

Shin-Etsu Polymer Co., Ltd., of Tokyo, Japan, manufactures and markets an anisotropically pressure-sensitive electroconductive composite material, sold as AF and MAF interconnector material, in sheet form. That material has electrically conductive fibers uniformly dispersed in the matrix of an electrically insulating polymer with each conductive fiber aligned substantially perpendicularly to the plane of each surface of the sheet. When this material is compressed, surface to surface, a very low electrical resistance is observed in the direction perpendicular to the plane of the surfaces of the sheet (through the sheet), and a high insulative resistance is observed in all other directions within the plane of the surface of the sheet. Several patents have issued on this material and its applications which include U.S. Pat. Nos. 4,199,637; 4,210,895; 4,252,391; and 4,252,990.

A connector configuration in which the density of the conductive paths can be increased significantly over those currently available with no increase in path resistance, capacitance or cross-talk is highly desirable. The present invention provides a connector wherein the conductive paths can be packed one every 0.004 (flexible circuit to flexible circuit) to 0.008 (etched circuit board to etched circuit board or etched circuit board to flexible circuit) square inches of board space with the same or greatly improved resistive, capacitive and cross-talk characteristics over prior art connectors.

SUMMARY OF THE INVENTION

In accordance with the illustrated embodiments, the present invention provides method and apparatus for achieving a high density interconnection between at least two circuit boards, flexible circuits, or a mixture of both. On each of the boards or flexible circuits the conductive paths are laid out in a complementary pattern, so that when the boards and circuits are overlapped with the conductive paths facing each other, the paths to be interconnected one with the other are adjacent to each other when brought into alignment. To produce the interconnection of the conductive paths an anisotropic elastomeric polymer material is inserted between the overlapping edges and the sandwich clamped together to compress the polymer material sufficiently to establish a low electrical resistance path through the polymer material thus interconnecting the conductive paths of the boards and circuits as desired.

The present invention could be embodied in many forms and the disclosure of only two detailed embodiments herein are not intended to be limiting on the full scope of the present invention. The following is a summary of the two detailed embodiments disclosed herein. One disclosed embodiment utilizes backing plates above and below the sandwich with a plurality of screws passing through registration holes to align the conductive paths and to provide closure of the connector. The other disclosed embodiment is designed to interconnect two boards along substantially the full width of the boards. This is accomplished with clamping bars that have thumb screws at either end and at selected spacings along the length of the clamping bars to ensure closure between the two boards. The thumb screws here also pass through registration holes in the sandwich. Further, bosses are included around each of the thumb screw holes in the clamping bars to align both the conductive paths and the boards.

DESCRIPTION OF THE PREFERRED EMBODIMENTS

Figure 1:
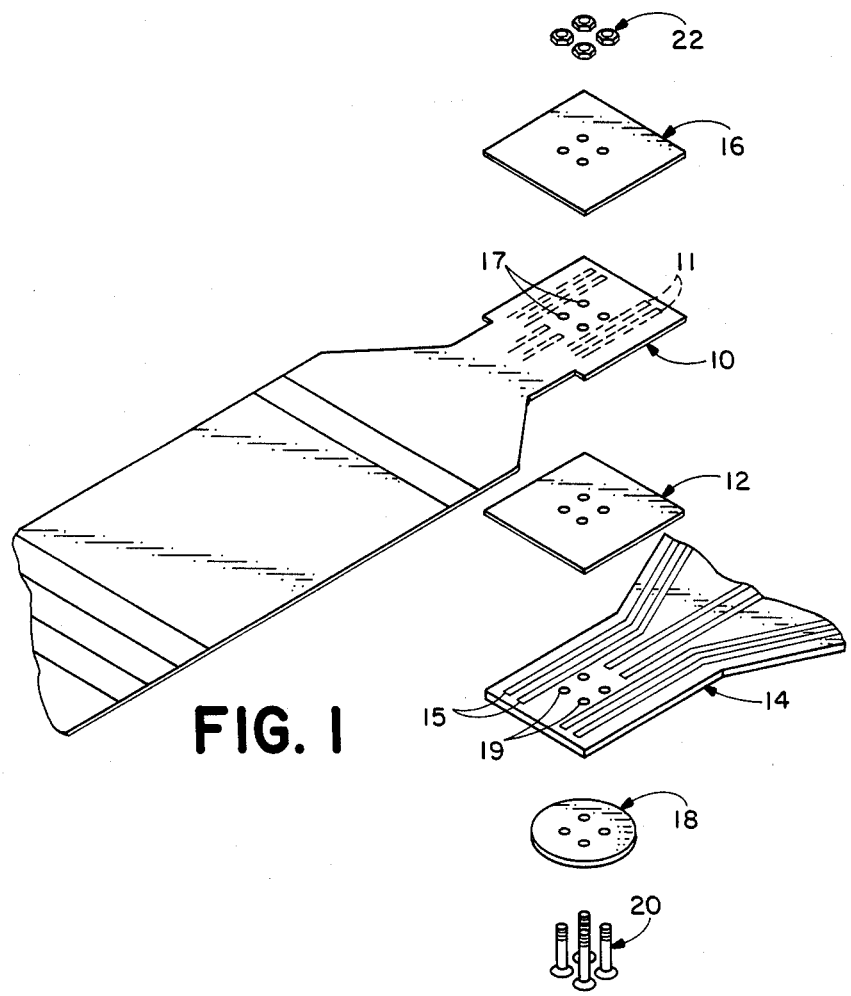
FIG. 1 is an exploded perspective view of a first embodiment connector of the present invention for interconnecting a flexible circuit with an etched circuit board.

Referring now to FIG. 1, there is shown an exploded perspective view of the first embodiment of the high density connector of the present invention. In this view, flexible circuit (or ribbon cable) 10 is to be interconnected with etched circuit board 14. This is accomplished by printing the traces 15 on the circuit board 14 so that they are a mirror image of the traces 11 on the underside of flexible circuit 10 to which they are to interconnect. In addition, the same pattern of registration holes 17 and 19 are provided in the interconnection portions of flexible circuit 10 and circuit board 14 to align exposed traces 11 and 15 opposite each other when the connector is assembled. This same pattern of registration holes is repeated in each layer of the connector. The other components of the connector include an interface sheet 12 of an anisotropic elastomeric polymer material (e.g., AF or MAF type from Shin-Etsu Polymer Co., Ltd.) sandwiched between the interconnection portions of flexible circuit 10 and circuit board 14. The assembly is completed by placing backing plate 18 beneath the interconnection portion of circuit board 14, backing plate 16 above the interconnection portion of flexible circuit 10, inserting screws 20 through the registration holes in each layer and screwing nuts 22 onto the portion of the shanks of screws 20 which extends above plate 16. Screws 20 are then tightened to compress interface sheet 12 sufficiently to produce the desired low resistance connection between traces 15 of circuit board 14 and trace 11 of flexible circuit 10. Since the electrically conductive fibers in interface sheet 12 are oriented perpendicularly to the two surfaces of the sheet, only one of the exposed traces 11 on flexible circuit 10 are interconnected with each one of an adjacent exposed trace 15 on circuit board 14.

In FIG. 1, backing plates 16 and 18 are shown as square and circular, respectively. Plate 16 has been selected to have the same size and shape as the interconnection tab of flexible circuit 10 to hold it flat against interface sheet 12 to insure the electrical connection with the traces on circuit board 14.

The configuration of FIG. 1 could be modified to interconnect two flexible circuits or two circuit boards to each other. For interconnecting two circuit boards, flexible circuit 10 need only be replaced by the desired circuit board. In the case of the interconnection of two flexible circuits, circuit board 10 would be replaced by the second flexible circuit and backing plate 18 would also have to be replaced with one which is sized and shaped the same as backing plate 16 to provide the necessary rigidity to the sandwich of the two flexible circuits and interface sheet 12 to insure their electrical interconnection.

Further, in some applications, the side of flexible cable 10 and circuit board 14 opposite their respective traces 11 and 15 may include a continuous or segmented ground plane. In such applications, backing plates 16 and 18 could be electrically conductive and provide a means for connecting them, for example, to ground or the signal return line of the device in or to which this connector finds applications.

Figure 2:
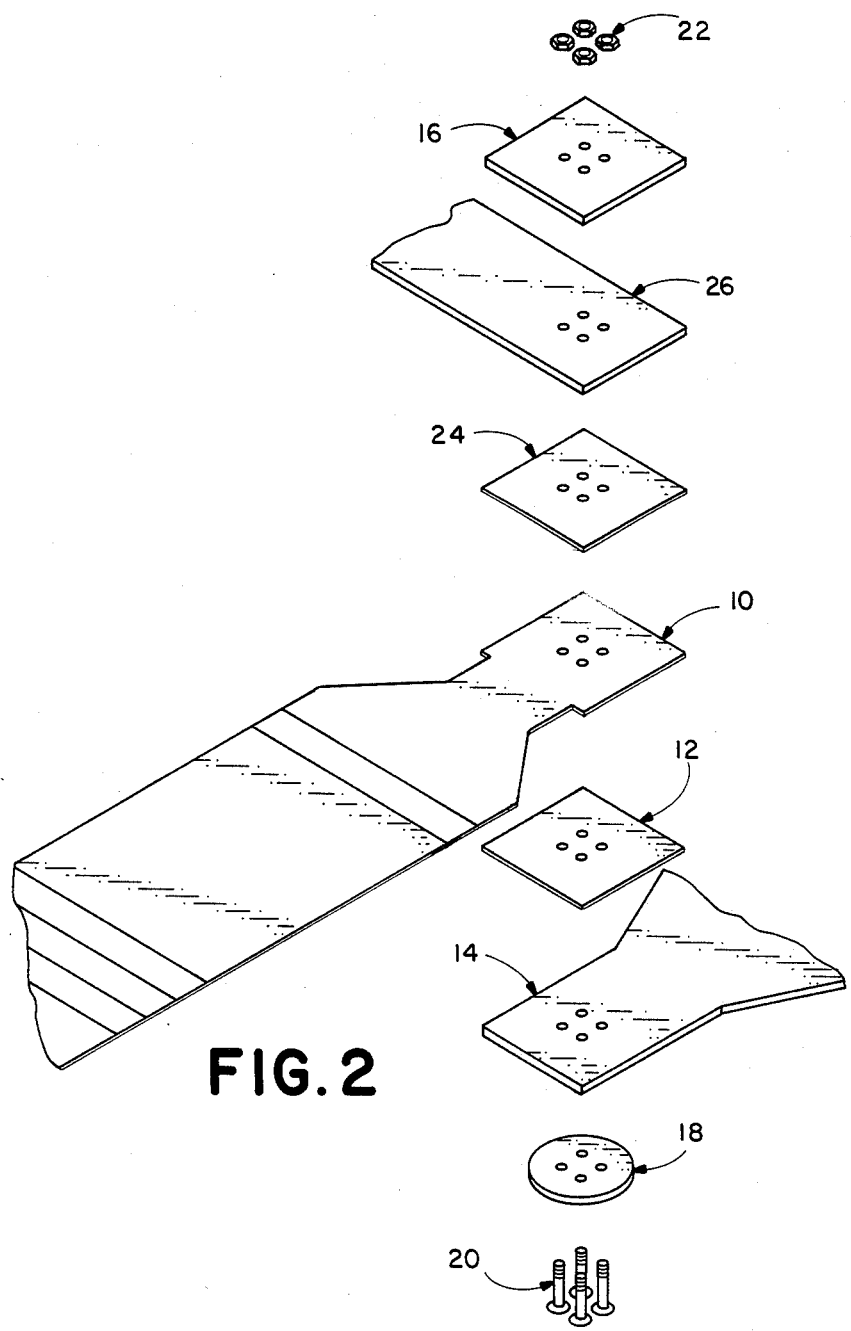
FIG. 2 is an exploded perspective view of a modified first embodiment of FIG. 1 wherein two etched circuit boards are interconnected with a flexible circuit.

FIG. 2 shows a modification of the high density connector of FIG. 1 in which a circuit board is connected to both sides of flexible circuit 10. This requires the addition of a second interface sheet 24 between flexible circuit 10 and added circuit board 26. As can be seen from FIGS. 1 and 2, this approach lends itself to the inclusion of as many layers of interconnections as may be required.

Figure 3:
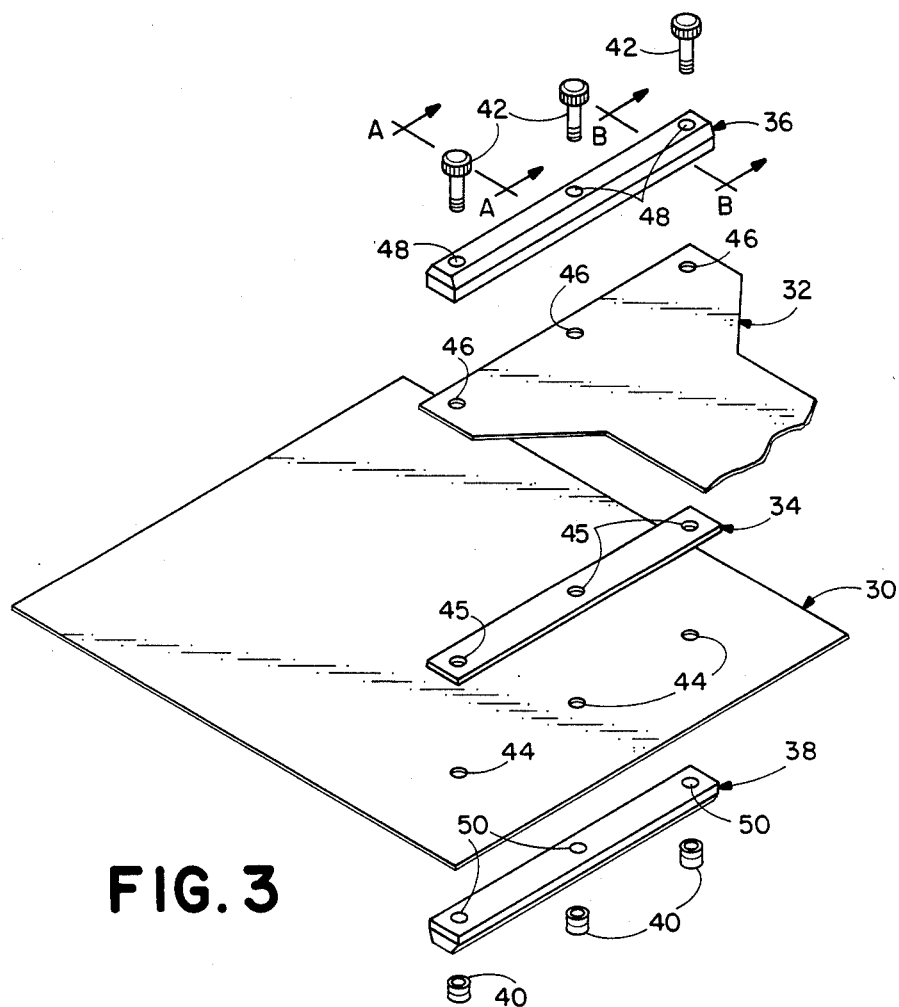
FIG. 3 is an exploded perspective view of a second embodiment of the connector of the present invention for interconnecting a flexible circuit with an etched circuit.

Next, FIG. 3 shows an exploded perspective view of a second embodiment of the high density connector of the present invention. This implementation lends itself to the interconnection of a large number of aligned traces of a flexible circuit 32 and a circuit board 30. As with the first embodiment, this embodiment also lends itself to interconnecting two flexible circuits, two circuit boards, or a mixed stack of flexible circuits and circuit boards.

Figure 4:
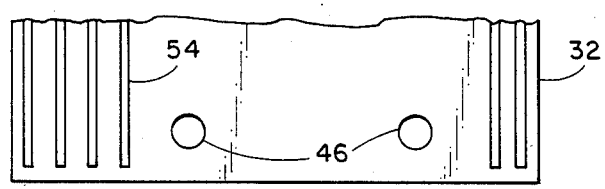
FIG. 4 is a plan view of the surfaces of typical flexible circuits and etched circuits boards that are to be interconnected by the present invention.
Figure 4:
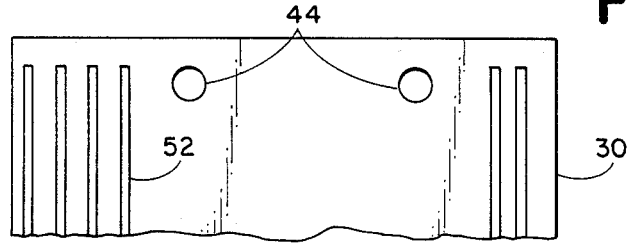

In FIG. 3, in addition to circuit board 30 and flexible circuit 32, the high density connector includes an anisotropic elastomeric polymer interface sheet 34, top and bottom clamping bars 36 and 38, nuts 40, and thumb screws 42. Nuts 40 can be ultrasonically inserted in holes 50 in the bottom clamping bar 38 and thumb screws 42 may be captured within top clamping bar 36 by means of ultrasonically inserted retaining collars 60 (FIG. 5), with the number and spacing of thumb screws 42 being determined by the length of the clamping bars, and the number and types of boards and circuits being interconnected. In addition, the alignment holes 44, 45 and 46 in circuit board 30, interface sheet 34 and flexible circuit 32, respectively, are equally spaced and placed to align the conductive traces 52 and 54 (FIG. 4) of circuit board 30 and flexible circuit 32, respectively, to insure proper interconnection of the conductive traces. The spacing between holes 48 and 50 in the top and bottom clamping bars are also the same as the registration holes in the circuit board and flexible circuit to maintain alignment when thumb screws 42 and clamp bosses are extended through the registration holes in the flexible circuit 32, interface sheet 34 and circuit board 30, and screwed into nuts 40 within the bottom clamping bar.

Figure 5:
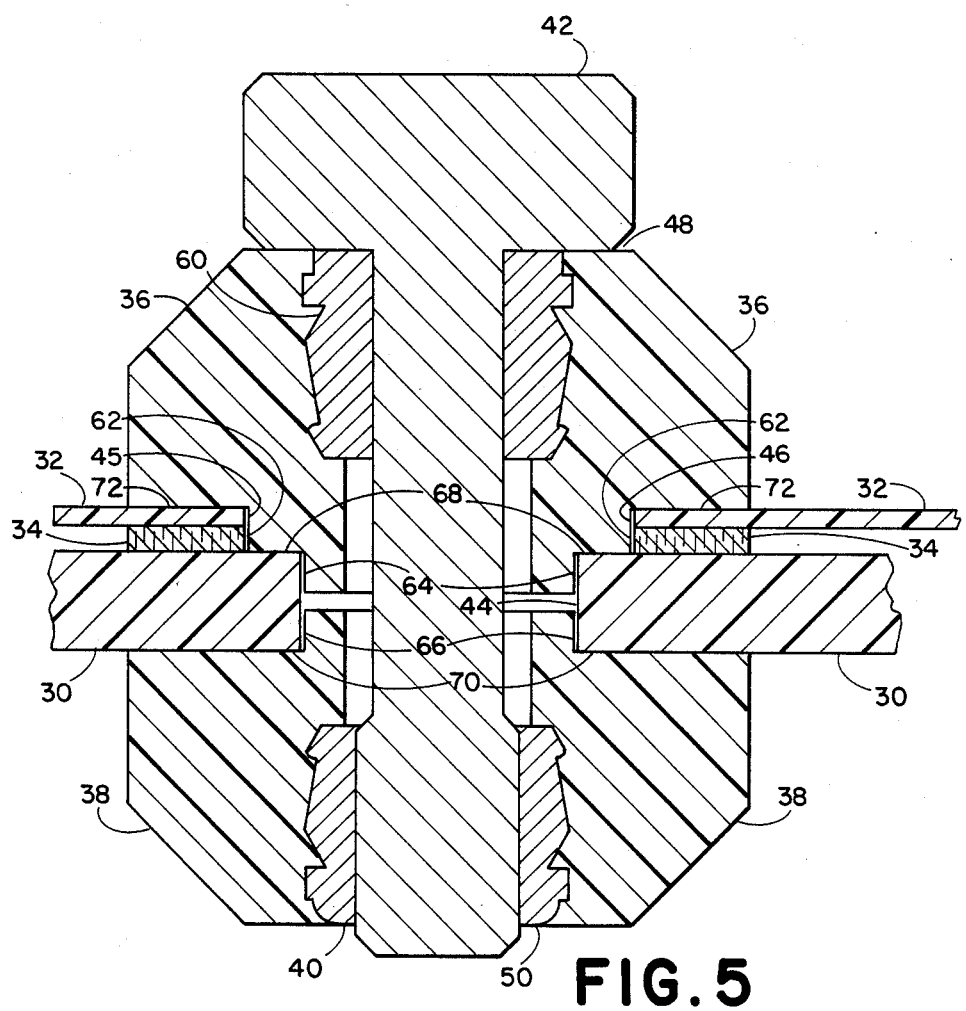
FIG. 5 is a first cross-sectional view of the second embodiment when fully assembled and taken along line A—A of FIG. 3.
Figure 8B:
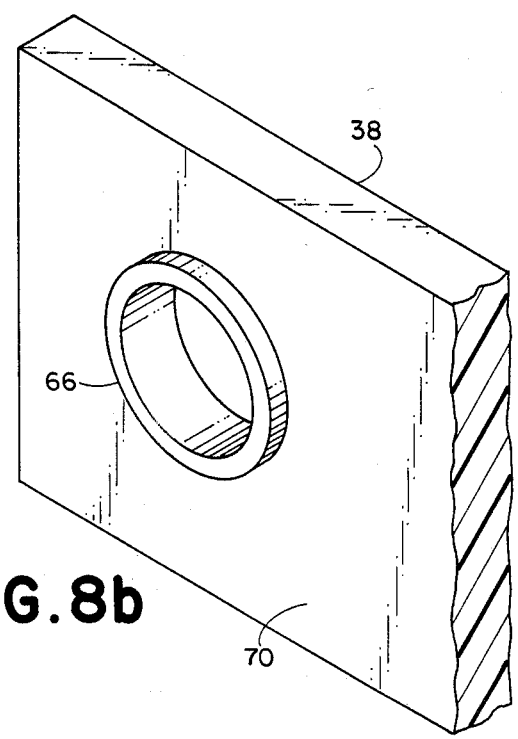
FIGS. 8a and b are partial cut-away perspective views which illustrate the boss details of the clamping bars of the second embodiment of FIG. 3.
Figure 8A:
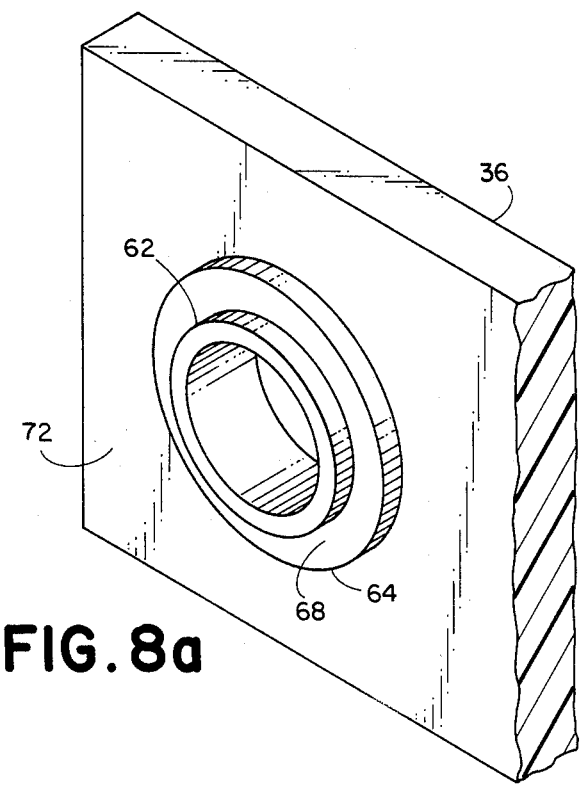

Referring next to FIG. 5, there is shown a first cross-sectional view of the assembled connector of FIG. 3 taken through the center-line of one of thumb screws 42 along line A—A of FIG. 3. It can be seen that registration holes 45 and 46, in the interface sheet and flexible circuit 32, respectively, are of the same diameter which is slightly larger than the diameter of boss 62 of top clamping bar 36, and the diameter of registration holes 44 in circuit board 30 are slightly larger than the diameter of bosses 64 and 66 of the top and bottom clamping bars 36 and 38, respectively, with the diameter of bosses 64 and 66 being smaller than the diameter of boss 62. The height of boss 62 is selected to be equal to the sum of the thicknesses of flexible circuit 32 and the desired compressed thickness of interface sheet 34. The combined height of bosses 64 and 66 is selected to be less than the thickness of circuit board 30 to ensure that the interface sheet 34 is appropriately compressed when the connector is fully assembled. In this configuration, the top and bottom surfaces of circuit board 30 provide the stop against which shoulders 68 and 70 of top and bottom clamping bars 36 and 38, respectively, seat when the connector is fully assembled. FIGS. 8a and 8b further illustrate the details of bosses 62–66 of the top and bottom clamping bars 36 and 38.

Figure 6:
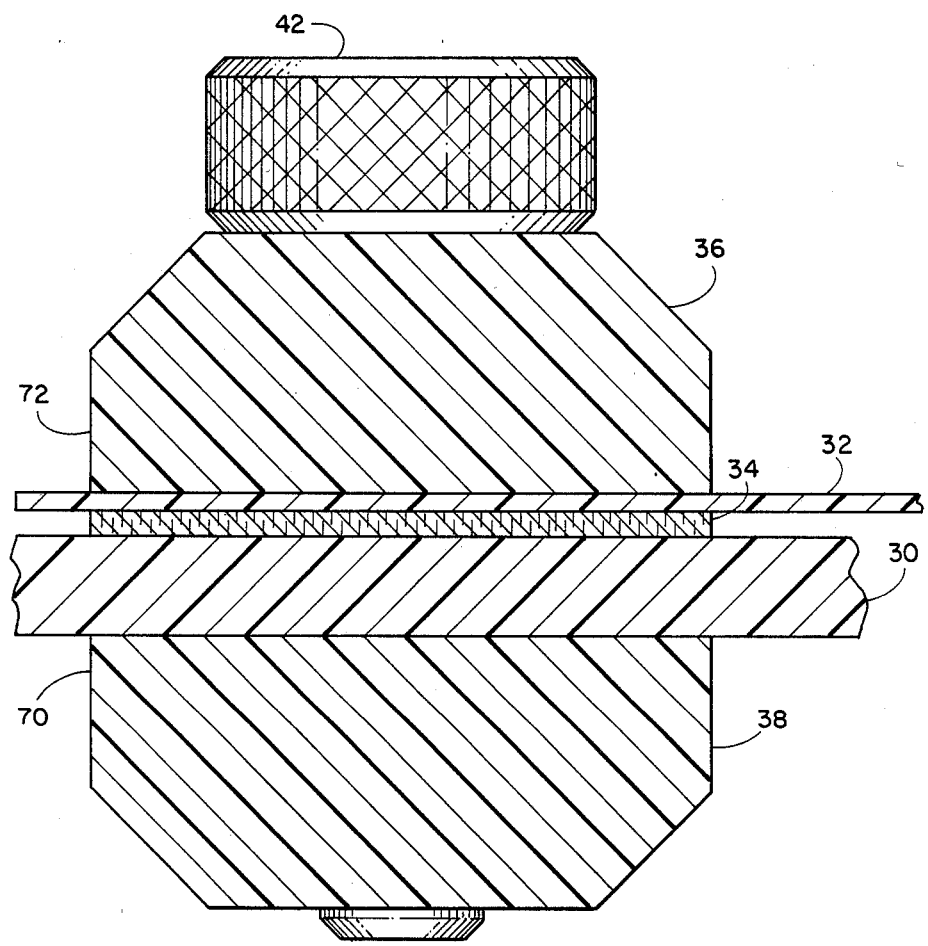
FIG. 6 is a first cross-sectional view of the second embodiment when fully assembled and taken along line B—B of FIG. 3.
Figure 7:
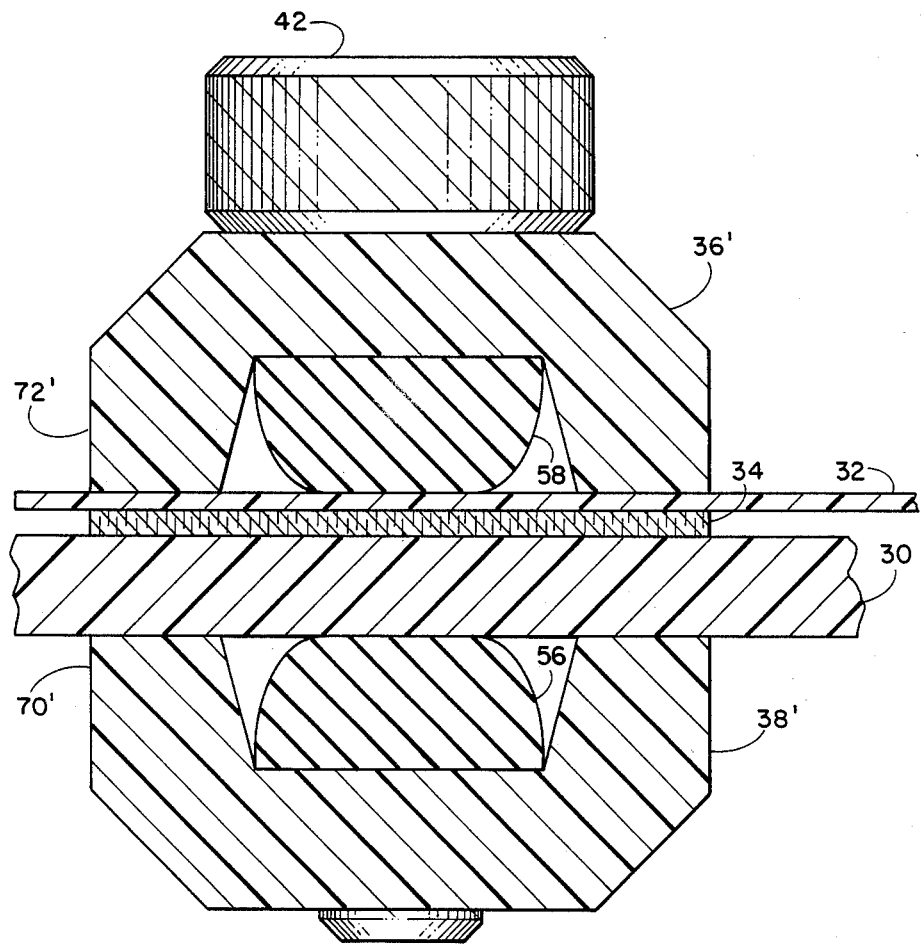
FIG. 7 is a second cross-sectional view of the second embodiment when fully assembled and taken along line B—B of FIG. 3.

The surfaces, or shoulders 72 and 70, of the top and bottom clamping bars 36 and 38, respectively, may take on different configurations between thumb screws 42. FIGS. 6 and 7 each show a possible configuration for those surfaces. In FIG. 6, shoulders 70 and 72 are shown as being flat. In FIG. 7, shoulders 70' and 72' are shown having a cavity which incorporates an elastomeric or other type of spring 56 and 58, respectively. Springs 56 and 58 bias flexible circuit 32 and circuit board 30 together to compress interface sheet 34 the desired amount at the point of interconnection of the conductive traces on flexible circuit 32 and circuit board 30. Thus, the elastomeric springs may be localized, or run substantially the full length, between thumb screws 42. Further, the connector could have a combination of the two clamping bars, e.g., one with an elastomeric spring above the flexible circuit and a flat one below the circuit board. Further, shoulders 70 and 72, or springs 56 and 58 could be coated with a conductive film to provide a connection to a ground plane on the back of either the flexible circuit 32 or circuit board 30.

Figure 9:
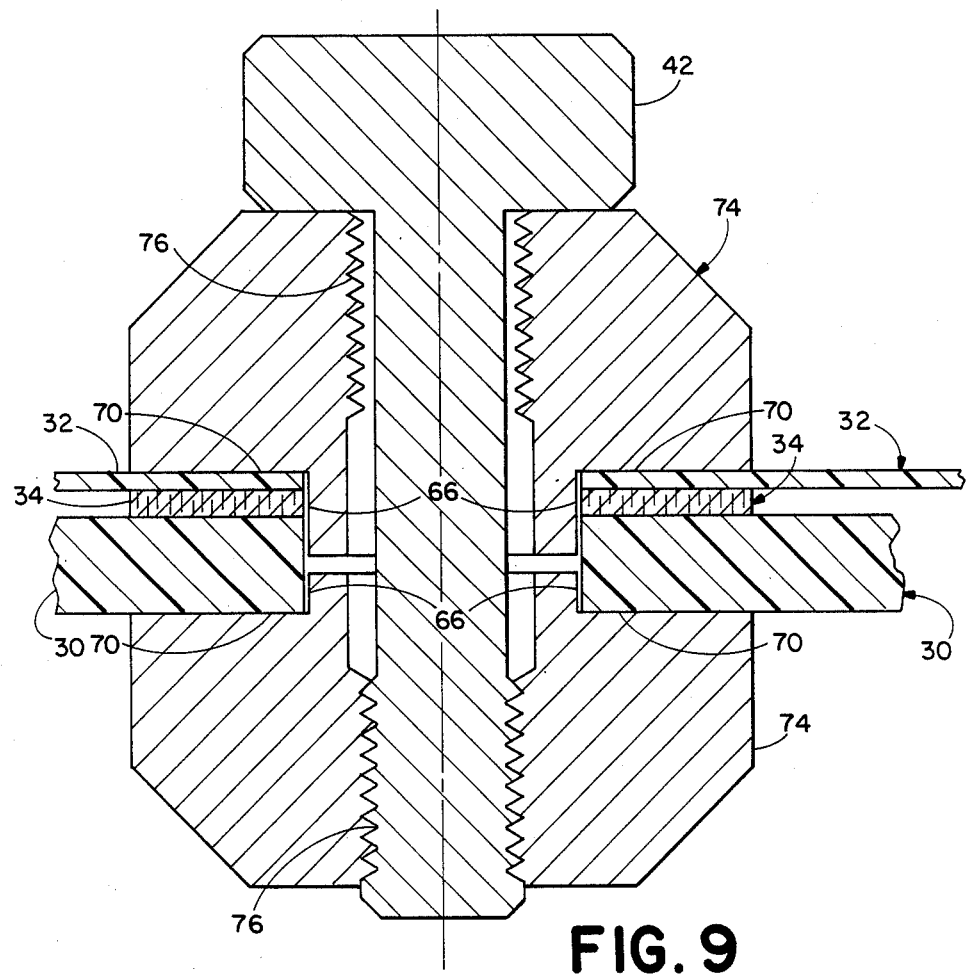
FIG. 9 is a second cross-sectional view of the second embodiment when fully assembled and taken along line A—A of FIG. 3.

Referring now to FIG. 9, there is shown a second cross-sectional view of the assembled connector of FIG. 3 taken through the center-line of one of thumb screws 42 along line A—A of FIG. 3. This configuration is similar to the one shown in FIG. 5. Here the two clamping bars 74 have the same cross-sectional shapes, and, therefore the same diameter bosses 66. Thus, the registration holes of the etched circuit board 30, flexible circuit 32 and interface sheet 34 are the same diameter. In addition, clamping bars 74 are tapped to provide mating threads 76 to the threaded portion of thumb screws 42. This configuration allows for the clamping together of sandwiches of varying thicknesses or combinations of circuit boards, interface sheets and flexible circuits. With this configuration, sufficient torque must be applied to thumb screw 42 to provide the necessary compression of interface sheet 34 to interconnect the circuits on board 30 and flexible circuit 32. Further, clamping bars 74, while cross-hatched as metal, may be of any selected material with sufficient rigidity to provide the desired clamping action, and between the thumb screws 42 they too could be configured as clamping bars 36, 38, 36' and 38' in FIGS. 6 and 7.

Several factors determine the maximum density of the interconnections for this type of connector. They are the precision to which the traces can be printed and the registration holes placed with respect thereto, the width of the traces necessary to conduct a signal of a particular power level, and the density of the conductive fibers in the interface sheet and its power handling capability. Based on experiments with the connector embodiments of the present invention, it has been determined that a conductive path density of one conductor per 0.004 (flexible circuit to flexible circuit) to 0.008 (etched circuit board to etched circuit board or etched circuit board to flexible circuit) square inches of board space has been demonstrated. In addition, series interconnection resistances of 15 milliohms has been measured as opposed to 25 milliohms in the prior art connectors, and reduced shunt capacitance and cross-talk between signals as a result of the shielding effect of the unused conductive fibers of the interface sheet which surround those conductive fibers that provide each interconnection path. All of this results in reduced signal distortion of high frequency signals.

While this invention has been described in terms of two preferred embodiments with variations on each, it is contemplated that persons reading the preceding descriptions and studying the drawings will realize various alterations and modifications thereof. It is therefore intended that the following appended claims be interpreted as including all such alterations and modifications as fall within the true spirit and scope of the present invention.

What is claimed is:

1. Apparatus for producing a high density of electrical interconnections of conductive paths on at least one side of at least two independent flat devices, when those devices are overlapped with the conductive paths on one device opposite the conductive paths on the other device at the point of interconnection, said paths on one device having a complementary pattern to that of the paths of the other device at the point of interconnection, said apparatus comprising:

means for aligning a selected portion of the conductive paths on one device opposite a selected portion of the conductive paths on the other device so that each pair of selected portions of conductive paths which are to be interconnected is adjacent the other and of a complementary pattern at the point of interconnection, said aligning means includes at least two registration holes precisionally located through the two independent devices for aligning the conductive paths thereon at the point of interconnection;

an anisotropic elastomeric polymer material disposed to be inserted between the conductive paths at the point of interconnection between each pair of devices, said anisotropic elastomeric polymer material includes registration holes therethrough in the same pattern as the registration holes through the two independent devices; and means for clamping together the sandwich of devices and the anisotropic elastomeric polymer material, said clamping means includes:

a first clamping bar means disposed to be juxtaposed the side of one of the devices without the conductive paths to be interconnected with the other of the at least two independent devices at the point of interconnection, said first clamping bar having registration holes in the same pattern as the registration holes through the device to which the first clamping bar is disposed to be juxtaposed, said first clamping bar means includes at least one first boss disposed to extend through a said registration hole of said one of the at least two independent devices and a said registration hole of the anisotropic elastomeric polymer material, and into at least one of the juxtaposed registration holes of said other of the at least two independent devices with the shape and size of the boss being substantially the same as the registration hole of at least said other of the at least two independent devices;

a second clamping bar means disposed to be juxtaposed the side of the other of the devices without the conductive paths to be interconnected with the one of the at least two independent devices at the point of interconnection, said second clamping bar having registration holes in the same pattern as the registration holes through the device to which the second clamping bar is disposed to be juxtaposed and having at least two second bosses disposed to extend into the registration holes of said other of the at least two independent devices with their size and shape being substantially the same as the first bosses without coming into contact with the first bosses in the assembled apparatus; and fastener means disposed to pass through the registration holes in the clamping bars and in each of the two independent devices and the anisotropic elastomeric polymer material for maintaining alignment thereof, and compressing the anisotropic elastomeric polymer material.

2. Apparatus as in claim 1 wherein:

the shape and size of the registration holes in said one of the at least two independent devices and the anisotropic elastomeric polymer material are substantially the same and substantially larger than the registration holes in the other of the at least two independent devices; and said first clamping bar means includes at least two third bosses each extending outward from the outer surface of said first boss with a smaller cross-sectional area than said first boss, each of said third bosses sized and shaped to extend through the registration holes of said one of the at least two independent devices and substantially into the registration holes of the anisotropic elastomeric polymer material, the length of each of the third bosses being equal to the sum of the thicknesses of the one of the at least two independent devices and the thickness of the anisotropic elastomeric polymer material when it is compressed to the desired thickness in the assembled apparatus.

3. Apparatus as in claim 1 wherein said clamping means further includes elastomeric spring means coupled to at least the first clamping bar means between the registration holes therethrough for applying pressure to the one of the at least two independent devices to compress the anisotropic elastomeric polymer material.

4. A high density electrical connector comprising:
a first flat device having a plurality of conductive paths thereon with a predetermined pattern, and having at least two registration holes therethrough;
a second flat device having a plurality of conductive paths thereon with those paths that are to be interconnected with some or all of the paths on the first device having a complementary pattern in a selected portion at the point of interconnection to those paths on the first device, and said second flat device having at least two registration holes therethrough in the same pattern as said registration holes through the first device;
said conductive paths on the two devices being disposed to overlap each other with the corresponding conductive paths of each device at the point of interconnection disposed adjacent each other when the registration holes in the first and second devices are in alignment;
an anisotropic elastomeric material disposed to be inserted between the conductive paths at the point of interconnection, said anisotropic elastomeric polymer material includes registration holes therethrough in the same pattern as the registration holes through the first and second flat devices;
means for aligning the conductive paths on one of the first and second devices with the conductive paths on the other so that each pair of conductive paths which are to be interconnected are adjacent each other at the point of interconnection, said aligning means includes said at least two registration holes precisionally located through the first and second devices for aligning the conductive paths thereon at the point of interconnection; and
means for clamping together the sandwich of the devices and the anisotropic elastomeric polymer material, said clamping means includes:
a first clamping bar means disposed to be juxtaposed the side of one of the first and second devices without the conductive paths to be interconnected with the other of the first and second devices at the point of interconnection, said first clamping bar having registration holes in the same pattern as the registration holes through the first or second device to which the first clamping bar is disposed to be juxtaposed, said first clamping bar means includes at least one first boss disposed to extend through at least one of said registration holes of said one of the first and second devices and a said registration hole of the anisotropic elastomeric polymer material, and into at least one of the juxtaposed registration holes of said other of the first and second devices with the shape and size of the first boss being substantially the same as the registration holes of at least said other of the first and second devices;
a second clamping bar means disposed to be juxtaposed the side of the other of the first and second devices without the conductive paths to be interconnected with the one of the first and second devices at the point of interconnection, said second clamping bar having registration holes in the same pattern as the registration holes through the first or second device to which the second clamping bar is disposed to be juxtaposed and having at least two second bosses disposed to extend into the registration holes of said other of the first and second devices with their size and shape being substantially the same as the first bosses without coming into contact with the first bosses in the assembled apparatus; and
fastener means disposed to pass through the registration holes in the clamping bars and in each of the first and second devices and the anisotropic elastomeric polymer material for maintaining alignment thereof, and compressing the anisotropic elastomeric polymer material.

5. A high density electrical connector as in claim 4 wherein:
the shape and size of the registration holes in said one of the first and second devices and the anisotropic elastomeric polymer material are substantially the same and substantially larger than the registration holes in the other of the first and second devices; and
said first clamping bar means includes at least two third bosses each extending outward from the outer surface of said first boss with a smaller cross-sectional area than said first boss, each of said third bosses sized and shaped to extend through the registration holes of said one of the first and second devices and substantially into the registration holes of the anisotropic elastomeric polymer material, the length of each of the third bosses being equal to the sum of the thicknesses of the one of the first and second devices and the thickness of the anisotropic elastomeric polymer material when it is compressed to the desired thickness in the assembled apparatus.

6. A high density electrical connector as in claim 4 wherein said clamping means further includes elastomeric spring means coupled to at least the first clamping bar means between the registration holes therethrough for applying pressure to the one of the first and second devices to compress the anisotropic elastomeric polymer material.

* * * * *